(12) United States Patent
Siomkos et al.

(10) Patent No.: US 12,021,065 B2
(45) Date of Patent: Jun. 25, 2024

(54) DOUBLE-SIDED INTEGRATED CIRCUIT MODULE HAVING AN EXPOSED SEMICONDUCTOR DIE

(71) Applicant: Qorvo US, Inc., Greensboro, NC (US)

(72) Inventors: John Robert Siomkos, Greensboro, NC (US); Edward T. Spears, Stokesdale, NC (US); Mark Crandall, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/498,577

(22) Filed: Oct. 11, 2021

(65) Prior Publication Data

US 2022/0028838 A1    Jan. 27, 2022

Related U.S. Application Data

(62) Division of application No. 16/119,554, filed on Aug. 31, 2018, now abandoned.

(51) Int. Cl.
*H01L 25/065* (2023.01)
*H01L 21/3105* (2006.01)
(Continued)

(52) U.S. Cl.
CPC ...... *H01L 25/0657* (2013.01); *H01L 21/3105* (2013.01); *H01L 21/31056* (2013.01);
(Continued)

(58) Field of Classification Search
CPC ............... H01L 23/552; H01L 23/66; H01L 2225/06537; H01L 2225/0657; H01L 2225/06572; H01L 1/31056; H01L 1/311; H01L 1/3105; H01L 1/3157; H01L 1/3185; H01L 25/043; H01L 25/165; H01L 31/0203
See application file for complete search history.

(56) References Cited

U.S. PATENT DOCUMENTS 4,882,657 A    11/1989 Braun
5,191,404 A    3/1993 Wu et al.
(Continued)

FOREIGN PATENT DOCUMENTS

CN    101840910 A    9/2010

OTHER PUBLICATIONS

Non-Final Office Action for U.S. Appl. No. 15/720,686, mailed Jun. 14, 2018, 17 pages.
(Continued)

*Primary Examiner* — David A Zarneke
(74) *Attorney, Agent, or Firm* — Withrow & Terranova, P.L.L.C.

(57) ABSTRACT

The present disclosure relates to a double-sided integrated circuit (IC) module, which includes an exposed semiconductor die on a bottom side. A double-sided IC module includes a module substrate with a top side and a bottom side. Electronic components are mounted to each of the top side and the bottom side. Generally, the electronic components are encapsulated by a mold compound. In an exemplary aspect, a portion of the mold compound on the bottom side of the module substrate is removed, exposing a semiconductor die surface of at least one of the electronic components.

13 Claims, 9 Drawing Sheets

(51) Int. Cl.
  *H01L 21/311* (2006.01)
  *H01L 23/00* (2006.01)
  *H01L 23/28* (2006.01)
  *H01L 23/552* (2006.01)
  *H01L 23/66* (2006.01)
  *H01L 25/04* (2023.01)
  *H01L 25/16* (2023.01)
  *H01L 31/0203* (2014.01)

(52) U.S. Cl.
  CPC ............ *H01L 21/311* (2013.01); *H01L 23/28* (2013.01); *H01L 23/552* (2013.01); *H01L 23/66* (2013.01); *H01L 24/96* (2013.01); *H01L 24/97* (2013.01); *H01L 25/043* (2013.01); *H01L 25/165* (2013.01); *H01L 31/0203* (2013.01)

(56) References Cited

U.S. PATENT DOCUMENTS

| | | | |
|---|---|---|---|
| 5,654,862 | A | 8/1997 | Worley et al. |
| 5,946,177 | A | 8/1999 | Miller et al. |
| 7,629,674 | B1 | 12/2009 | Foster |
| 7,906,371 | B2 | 3/2011 | Kim et al. |
| 8,498,166 | B1 | 7/2013 | Peachey et al. |
| 8,879,222 | B2 | 11/2014 | Singh |
| 8,910,023 | B2 | 12/2014 | Yang |
| 8,970,023 | B2 | 3/2015 | Chou et al. |
| 9,166,402 | B2 | 10/2015 | Schulmeyer et al. |
| 9,293,446 | B2 * | 3/2016 | Matsumoto ............ H01L 25/165 |
| 9,748,179 | B2 * | 8/2017 | Yoo ........................ H01L 23/481 |
| 9,935,083 | B2 * | 4/2018 | Lee ...................... H01L 25/0657 |
| 10,163,746 | B2 * | 12/2018 | Ryu ........................ H01L 21/565 |
| 10,594,135 | B2 | 3/2020 | Singh |
| 10,998,290 | B2 | 5/2021 | Watanabe et al. |
| 2002/0079568 | A1 | 6/2002 | Degani et al. |
| 2004/0056344 | A1 | 3/2004 | Ogawa et al. |
| 2004/0104469 | A1 | 6/2004 | Yagi et al. |
| 2004/0164425 | A1 | 8/2004 | Urakawa |
| 2007/0109697 | A1 | 5/2007 | Huh |
| 2007/0247772 | A1 | 10/2007 | Keppens et al. |
| 2009/0256244 | A1 | 10/2009 | Liao et al. |
| 2010/0232078 | A1 | 9/2010 | Bhattacharya et al. |
| 2012/0228749 | A1 | 9/2012 | Pagaila |
| 2013/0155639 | A1 | 6/2013 | Ogawa et al. |
| 2013/0155693 | A1 * | 6/2013 | Mi ........................ G02B 6/0043 362/360 |
| 2014/0355157 | A1 | 12/2014 | Huang et al. |
| 2015/0131231 | A1 * | 5/2015 | Yoo ...................... H05K 3/4007 29/841 |
| 2015/0282395 | A1 | 10/2015 | Raorane et al. |
| 2016/0035678 | A1 | 2/2016 | Yoo et al. |
| 2016/0190107 | A1 | 6/2016 | Meyer et al. |
| 2016/0276288 | A1 | 9/2016 | Lee et al. |
| 2016/0351509 | A1 | 12/2016 | Dang et al. |
| 2017/0141081 | A1 | 5/2017 | Lee et al. |
| 2017/0186708 | A1 | 6/2017 | Li et al. |
| 2017/0221835 | A1 | 8/2017 | Yoo et al. |
| 2017/0236785 | A1 | 8/2017 | Chen |
| 2017/0263565 | A1 | 9/2017 | Renard et al. |
| 2017/0290207 | A1 | 10/2017 | Smith et al. |
| 2017/0309575 | A1 | 10/2017 | Lee |
| 2017/0347462 | A1 | 11/2017 | Miwa |
| 2017/0358540 | A1 | 12/2017 | Min et al. |
| 2018/0138130 | A1 | 5/2018 | Lin et al. |
| 2018/0323128 | A1 | 11/2018 | Dias et al. |
| 2019/0020194 | A1 | 1/2019 | Liu et al. |
| 2019/0104653 | A1 | 4/2019 | Jandzinski et al. |
| 2019/0140353 | A1 | 5/2019 | Tombak et al. |
| 2020/0083705 | A1 | 3/2020 | Xavier |
| 2020/0075547 | A1 | 5/2020 | Siomkos et al. |
| 2023/0026633 | A1 * | 1/2023 | Yen ........................ H01L 23/562 |

OTHER PUBLICATIONS

Notice of Allowance for U.S. Appl. No. 16/115,155, mailed Jul. 22, 2020, 13 pages.
Extended European Search Report for European Patent Application No. 18190696.7, mailed Dec. 19, 2018, 17 pages.
Examination Report for European Patent Application No. 18190696.7, mailed May 13, 2020, 5 pages.
Examination Report for European Patent Application No. 18190696.7, mailed Jul. 27, 2020, 5 pages.
Intention to Grant for European Patent Application No. 18190696.7, mailed Nov. 3, 2020, 29 pages.
Non-Final Office Action for U.S. Appl. No. 16/119,554, mailed Feb. 4, 2020, 9 pages.
Final Office Action for U.S. Appl. No. 16/119,554, mailed Aug. 5, 2020, 10 pages.
Advisory Action for U.S. Appl. No. 16/119,554, mailed Oct. 16, 2020, 3 pages.
Non-Final Office Action for U.S. Appl. No. 16/119,554, mailed Nov. 27, 2020, 10 pages.
Final Office Action for U.S. Appl. No. 16/119,554, mailed May 11, 2021, 14 pages.
Non-Final Office Action for U.S. Appl. No. 16/547,762 mailed Jan. 25, 2021, 15 pages.
Notice of Allowance and Examiner-Initiated Interview Summary for U.S. Appl. No. 16/547,762 mailed May 25, 2021, 16 pages.
First Office Action for Chinese Patent Application No. 201811136918.3, mailed Jan. 31, 2023, 21 pages.
Second Office Action for Chinese Patent Application No. 201811136918.3, mailed Aug. 26, 2023, 10 pages.
Notification to Grant for Chinese Patent Application No. 201811136918.3, mailed Dec. 21, 2023, 6 pages.

* cited by examiner

DOUBLE-SIDED INTEGRATED CIRCUIT MODULE HAVING AN EXPOSED SEMICONDUCTOR DIE

RELATED APPLICATIONS

This application is a divisional of patent application Ser. No. 16/119,554, filed Aug. 31, 2018, the disclosure of which is hereby incorporated herein by reference in its entirety.

FIELD OF THE DISCLOSURE

The present disclosure relates to integrated circuit (IC) modules for electronic devices, and more particularly to double-sided IC modules for radio frequency (RF) applications.

BACKGROUND

Many electronic devices include multiple components, including integrated circuit (IC) modules. Such components are often mounted to circuit boards in order to provide various functionalities. Traditional IC modules include a substrate on which multiple IC components (e.g., semiconductor dice) are mounted. As electronic devices have become smaller, demand for more compact IC modules has increased.

One solution to forming compact electronic devices has been to form double-sided IC modules. A double-sided IC module mounts IC components to both of a top side and a bottom side of the module's substrate. However, electronic devices continue to drive further reductions in IC module size.

SUMMARY

The present disclosure relates to a double-sided integrated circuit (IC) module having an exposed semiconductor die. The double-sided IC module includes a module substrate with a top side and a bottom side. Electronic components are mounted to each of the top side and the bottom side. Generally, the electronic components are encapsulated by a mold compound. In an exemplary aspect, a portion of the mold compound on the bottom side is removed, exposing a semiconductor die surface of at least one of the electronic components.

Exposing the semiconductor die reduces an overall thickness of the double-sided IC module. In addition, exposing the semiconductor die can provide additional advantages, such as by providing a surface to which a heat exchange device can be coupled (e.g., to transfer heat away from the semiconductor die). In other examples, electrical, magnetic, or other connections can be formed between the semiconductor die and other electronic components through the exposed surface.

In an exemplary aspect, a radio frequency (RF) module is provided. The RF module includes a module substrate defining a top side and a bottom side. A plurality of electronic components is coupled to the top side and a semiconductor die coupled to the bottom side. The RF module also includes a first mold compound coupled to the semiconductor die and exposing a surface of the semiconductor die.

Another exemplary aspect relates to a method for assembling a RF module. The method includes the operations of coupling an electronic component to a top side of a module substrate and coupling a semiconductor die to a bottom side of the module substrate. The method also includes encapsulating the semiconductor die in a mold compound such that the mold compound at least partially surrounds the semiconductor die and removing a portion of the mold compound to expose a surface of the semiconductor die.

Another exemplary aspect relates to an electronic device. The electronic device includes a circuit board on which a plurality of electronic components is mounted and an IC module coupled to the circuit board. The IC module includes a module substrate having a top side and a bottom side adjacent the circuit board. The IC module also includes a first electronic component coupled to the top side and a second electronic component coupled to the bottom side. The IC module also includes a mold compound at least partially surrounding the second electronic component and exposing a surface of the second electronic component.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
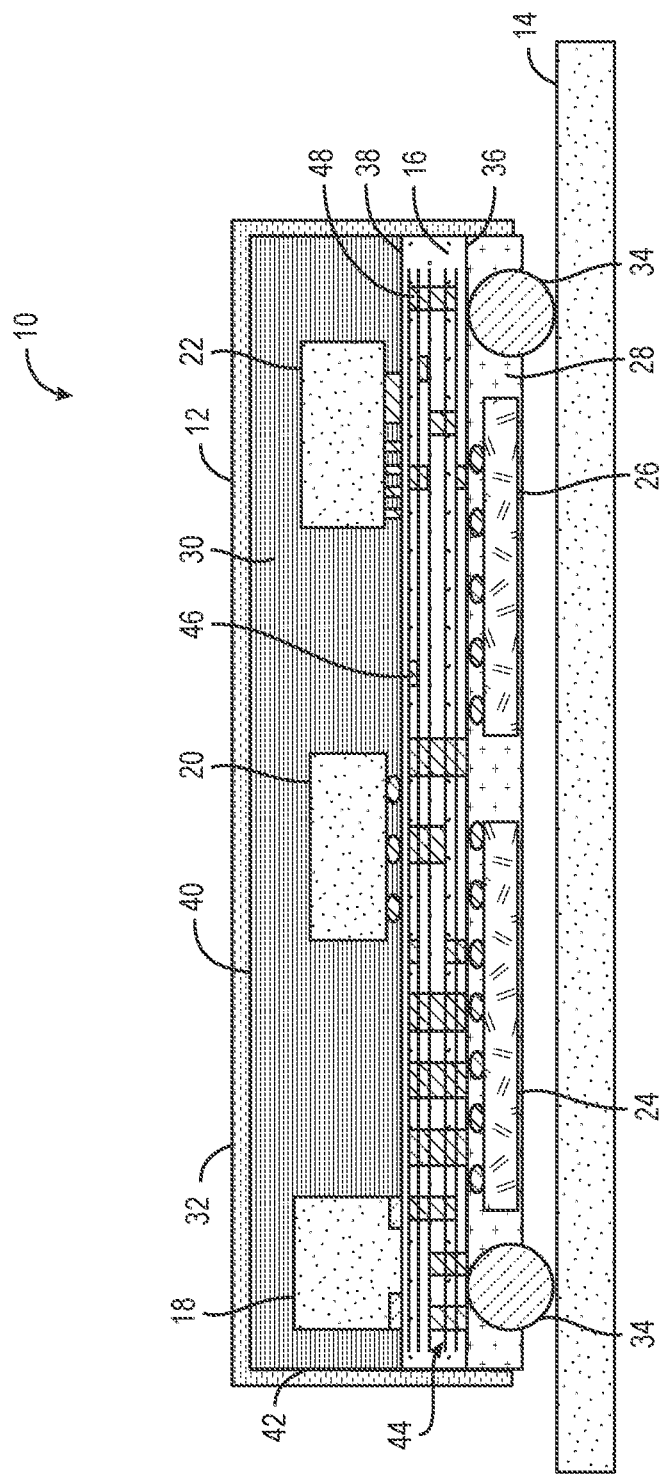
FIG. 1 illustrates an electronic device, which includes an integrated circuit (IC) module coupled to a circuit board.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a double-sided integrated circuit (IC) module having an exposed semiconductor die. The double-sided IC module includes a module substrate with a top side and a bottom side. Electronic components are mounted to each of the top side and the bottom side. Generally, the electronic components are encapsulated by a mold compound. In an exemplary aspect, a portion of the mold compound on the bottom side is removed, exposing a semiconductor die surface of at least one of the electronic components.

Exposing the semiconductor die reduces an overall thickness of the double-sided IC module. In addition, exposing the semiconductor die can provide additional advantages, such as by providing a surface to which a heat exchange device can be coupled (e.g., to transfer heat away from the semiconductor die). In other examples, electrical, magnetic, or other connections can be formed between the semiconductor die and other electronic components through the exposed surface.

In this regard, FIG. 1 illustrates an electronic device 10, which includes an IC module 12 coupled to a circuit board 14. For the purpose of this illustration, the IC module 12 is a shielded double-sided IC module, which includes a module substrate 16, a first top electronic component 18, a second top electronic component 20, a third top electronic component 22, a first bottom electronic component 24, and a second bottom electronic component 26. Each of the bottom electronic components 24, 26 is encapsulated by a first mold compound 28, and each of the top electronic components 18, 20, 22 is encapsulated by a second mold compound 30. As depicted, a shielding structure 32 can at least partially surround the IC module 12, and module contacts 34 couple the IC module 12 to the circuit board 14.

In further detail, the first bottom electronic component 24, the second bottom electronic component 26, and the module contacts 34 are attached to a bottom side 36 of the module substrate 16. In different applications, the IC module 12 may include fewer or more bottom electronic components 24, 26. Each of the bottom electronic components 24, 26 may be a flip-chip die, a wire-bonding die, a surface mounted device (SMD), an inductor, or other active or passive component. In an exemplary aspect, at least one of the bottom electronic components 24, 26 includes a semiconductor die.

The module contacts 34 are conductive and may be solder bumps or copper pillars forming an electrical connection with the circuit board 14 (e.g., connecting the top electronic components 18, 20, 22 and/or the bottom electronic components 24, 26 to other devices mounted on the circuit board 14). Each of the module contacts 34 can be used for grounded signals or non-grounded signals, and at least some of the module contacts 34 may be electrically isolated from other module contacts 34. The first mold compound 28 resides over the bottom side 36 of the module substrate 16 and encapsulates the first bottom electronic component 24 and the second bottom electronic component 26. Each module contact 34 is taller than the bottom electronic components 24, 26 and exposed through the first mold compound 28. The first mold compound 28 may be an organic epoxy resin or similar material. In an exemplary aspect, the first mold compound 28 is a 20 micron (μm) top cut material.

The first top electronic component 18 and the second top electronic component 20 are attached to a top side 38 of the module substrate 16. In different applications, the IC module 12 may include fewer or more top electronic components 18, 20. Each of the first top electronic component 18 and the second top electronic component 20 may be a flip-chip die, a wire-bonding die, a SMD, an inductor, or other active or passive component. The second mold compound 30 resides over the top side 38 of the module substrate 16 and encapsulates the first top electronic component 18 and the second top electronic component 20. The second mold compound 30 may be formed from a same or different material as the first mold compound 28.

As shown in FIG. 1, a top surface 40 of the IC module 12 is defined by a top surface of the second mold compound 30 (e.g., a surface opposite the module substrate 16). A side surface 42 of the IC module 12 is defined by a side surface of the second mold compound 30, a side surface of the module substrate 16, and a side surface of the first mold compound 28. The shielding structure 32 (e.g., shield layer) entirely covers the top surface 40 of the IC module 12 and entirely or almost entirely covers the side surface 42 of the IC module 12. The shielding structure 32 does not cover a bottom side of the IC module 12, which couples to the circuit board 14. Herein and hereafter, entirely covering a surface refers to covering at least 99% of the surface, while almost entirely covering a surface refers to covering at least 90% of the surface.

The shielding structure 32 can include a single layer of material, or it can include multiple layers of the same or different materials. For example, an interior layer (e.g., covering the top surface 40 and the side surface 42 of the IC module 12) may be formed of copper, aluminum, silver, gold, or other conductive materials with a thickness between 3 μm and 16 μm. An exterior layer may reside over the interior layer, and may be formed of nickel with a thickness between 1 μm and 3 μm.

Further, the module substrate 16 may be a laminate having a number of layers 44. These layers 44 of the module substrate 16 may include prepreg material. The module substrate 16 can also include conductive elements 46 and via structures 48, which may be formed of an appropriate conductive material. Generally, the conductive elements 46 and the via structures 48 form electrical connections between one or more of the electronic components 18, 20, 22, 24, 26 and the circuit board 14.

Figure 2:
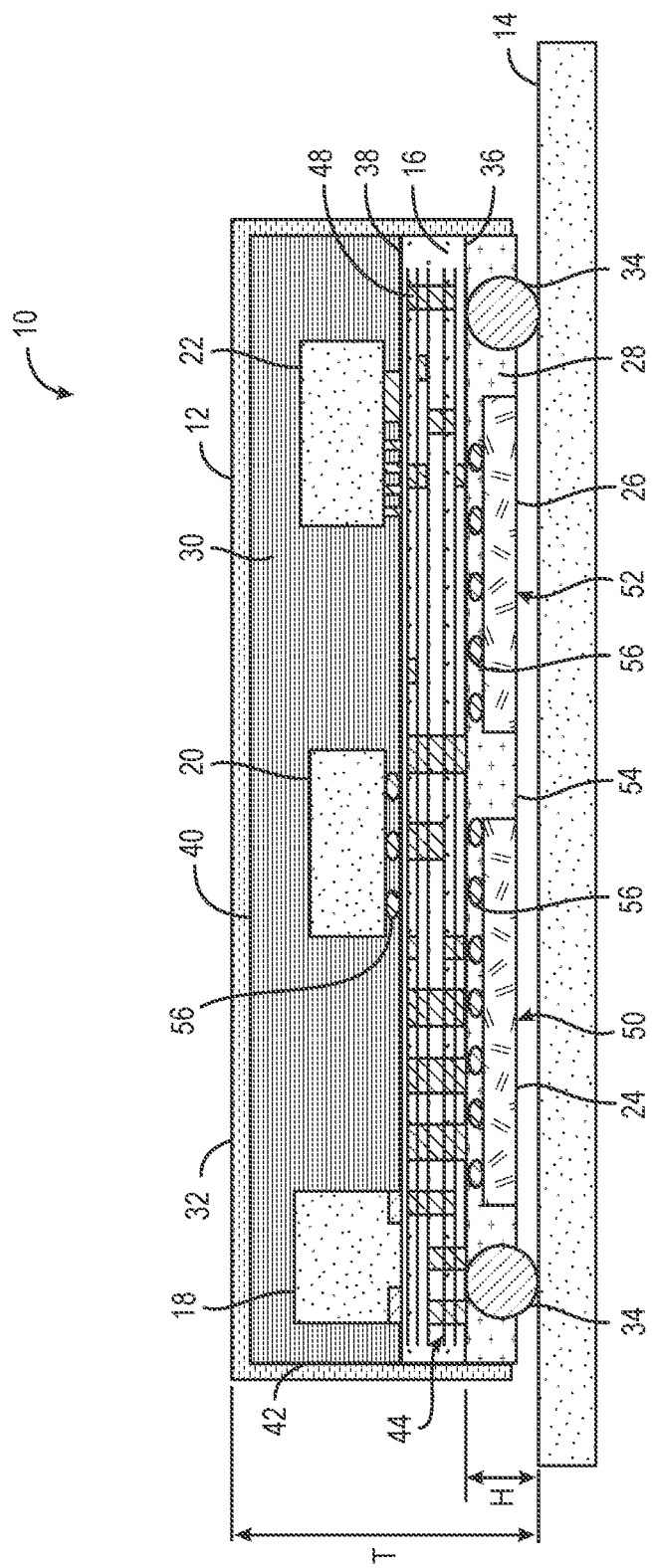
FIG. 2 illustrates the electronic device of FIG. 1 having a portion of the first mold compound on a bottom side of the IC module removed, exposing a semiconductor die surface of at least one bottom electronic component.

In an exemplary aspect, shown in FIG. 2, a portion of the first mold compound 28 on a bottom side of the IC module 12 is removed, exposing a semiconductor die surface 50, 52 of at least one of the bottom electronic components 24, 26. In some cases, the exposed semiconductor die surface 50, 52 is a bottom surface of the bottom electronic component 24, 26 facing opposite the module substrate 16. Thus a bottom surface 54 of the IC module 12 is defined by the semiconductor die surface(s) 50, 52 and a bottom surface of the first mold compound 28. In some examples, one of the semiconductor die surfaces 50, 52 is exposed (e.g., the semiconductor die surface 50, 52 further below the module substrate 16), while in other examples two or more semiconductor die surfaces 50, 52 are exposed.

In detail, the IC module 12 may be a radio frequency (RF) module, providing processing, signal conditioning, controls, and/or similar functions for RF signals of the electronic device 10. Accordingly, the top electronic components 18, 20, 22 and bottom electronic components 24, 26 of the RF module 12 may be configured for RF operation. Each of the electronic components 18, 20, 22, 24, 26 and the module contacts 34 are mounted to the module substrate 16 through an appropriate technique. For example, the first top electronic component 18 and the third top electronic component 22 are each a SMD which is mounted by solder, reflow, an adhesive, or similar technique. The second top electronic component 20, the first bottom electronic component 24, and the second bottom electronic component 26 are each a semiconductor die (e.g., a flip-chip die or a wire-bonding die) mounted to the module substrate 16 through a set of solder bumps 56 or similar conductive elements (e.g., through a reflow process). It should be understood that the mounting of the electronic components 18, 20, 22, 24, 26 is shown for illustrative purposes, and each component may be mounted differently in different applications.

The first mold compound 28 is applied over the bottom side 36 of the module substrate 16 to encapsulate each bottom electronic component 24, 26 as depicted in FIG. 1, and removed to expose at least one semiconductor die surface 50, 52 as depicted in FIG. 2. The first mold compound 28 may be applied by various procedures, such as sheet molding, overmolding, compression molding, transfer molding, dam fill encapsulation, or screen print encapsulation. In an exemplary aspect, if there is space between the bottom side 36 of the module substrate 16 and a bottom electronic component 24, 26, the first mold compound 28 fills the space. A curing process hardens the first mold compound 28.

Similarly, the second mold compound 30 is applied over the top side 38 of the module substrate 16 to encapsulate each top electronic component 18, 20, 22. The second mold compound 30 may be the same or a different material as the first mold compound 28, and may be applied through the same or a different technique. In some cases, both the first mold compound 28 and the second mold compound 30 are applied in a same process, and in other cases the first mold compound 28 and the second mold compound 30 are applied in separate processes.

By removing a portion of the first mold compound 28 to expose at least one semiconductor die surface 50, 52, a height H of the module contacts 34 can be reduced. In addition, an overall thickness T of the IC module 12 is reduced. In an exemplary aspect, a thickness of each bottom electronic component 24, 26 is between 40 μm and 150 μm thick, and a thickness of the first mold compound 28 (e.g., a distance between the bottom surface 54 of the IC module 12 and the bottom side 36 of the module substrate 16) is between 80 μm and 200 μm. In addition, the height H of the module contacts 34 is between 100 and 300 μm prior to attachment to the circuit board 14.

Figure 3A:
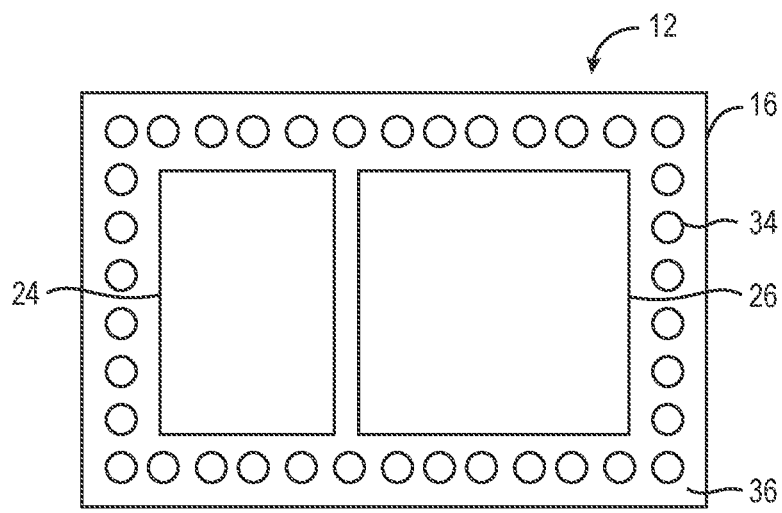
FIG. 3A illustrates an exemplary bottom view of the IC module of FIG. 2 prior to encapsulating the bottom electronic components in the first mold compound.
Figure 3B:
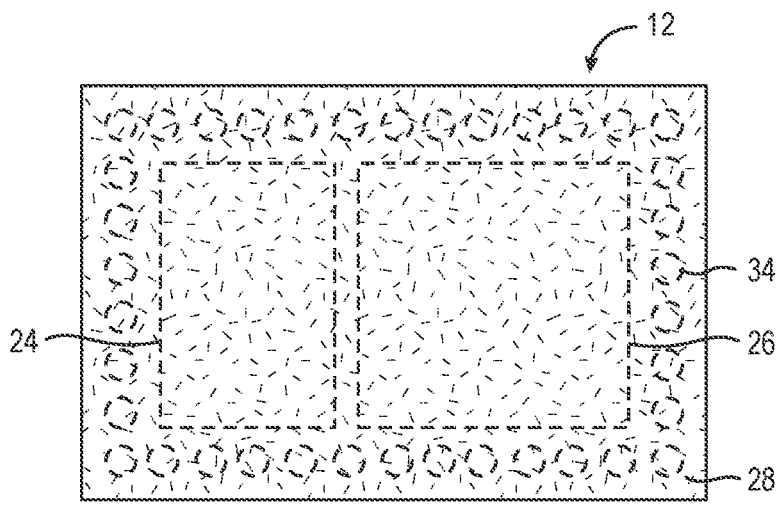
FIG. 3B illustrates another exemplary bottom view of the IC module of FIG. 2 with the bottom electronic components encapsulated in the first mold compound.
Figure 3C:
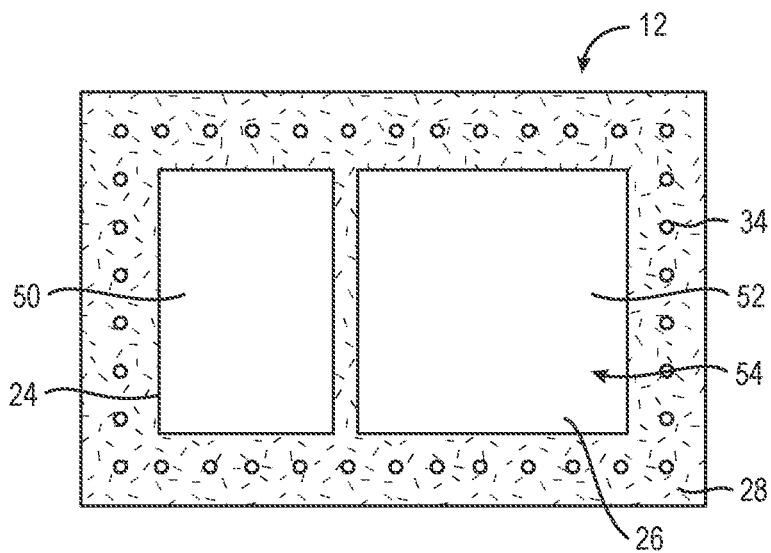
FIG. 3C illustrates another exemplary bottom view of the IC module of FIG. 2 after a portion of the first mold compound is removed to expose the semiconductor die surface.

The process of exposing the semiconductor die surface 50, 52 is further illustrated in FIGS. 3A-3C. In addition, exposing the semiconductor die surface 50, 52 can provide additional advantages, such as by providing a surface for coupling a device to the bottom electronic component 24, 26 or by facilitating connections between the bottom electronic component 24, 26 and the circuit board 14, as discussed further with respect to FIGS. 4A-4E. It should be understood that variations in components of the IC module 12 are contemplated, as depicted in FIG. 4F.

FIGS. 3A-3C provide exemplary steps that illustrate a process to fabricate the IC module 12 shown in FIG. 2 having the exposed semiconductor die surface 50, 52. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 3A-3C. FIG. 3A illustrates an exemplary bottom view of the IC module 12 of FIG. 2 prior to encapsulating the bottom electronic components 24, 26 in the first mold compound 28. FIG. 3B illustrates another exemplary bottom view of the IC module 12 of FIG. 2 with the bottom electronic components 24, 26 encapsulated in the first mold compound 28. FIG. 3C illustrates another exemplary bottom view of the IC module 12 of FIG. 2 after a portion of the mold compound 28 is removed to expose the semiconductor die surface 50, 52.

The first bottom electronic component 24, the second bottom electronic component 26, and the module contacts 34 are attached at the bottom side 36 of the module substrate 16 as depicted in FIG. 3A. In different applications, there may be more or fewer bottom electronic components 24, 26 or more or fewer module contacts 34 attached to the module substrate 16. Some module contacts 34 may be used for grounded signals, and may be electrically isolated from other module contacts 34 which are used for non-grounded signals. Herein, the module contacts 34 are taller than the first bottom electronic component 24 and the second bottom electronic component 26.

After the first bottom electronic component 24, the second bottom electronic component 26, and the module contacts 34 are attached, the first mold compound 28 is applied to the IC module 12 as depicted in FIG. 3B. The first mold compound 28 resides over the bottom side 36 of the module substrate 16 to encapsulate each bottom electronic component 24, 26 and each module contact 34. In some examples, the bottom electronic components 24, 26 and the module contacts 34 are entirely encapsulated, and in other embodiments, the module contacts 34 are only partially encapsulated. As described above, the first mold compound 28 may be applied by various procedures. In an exemplary aspect, the first mold compound 28 is overmolded. A curing process hardens the first mold compound 28.

After the first mold compound 28 is applied and cured, a portion of the first mold compound 28 is removed to expose the at least one semiconductor die surface 50, 52 of the bottom electronic components 24, 26 as depicted in FIG. 3C. The removal of the portion of the first mold compound 28 may be done with a mechanical grinding process, a chemical removal process, a laser ablation, or other appropriate technique. After the removal process, the bottom surface 54 of the IC module 12 is defined by the semiconductor die surface(s) 50, 52 and a bottom surface of the first mold compound 28. In some applications, the bottom surface 54 is a common plane at and around the semiconductor die surface(s) 50, 52.

Figure 4A:
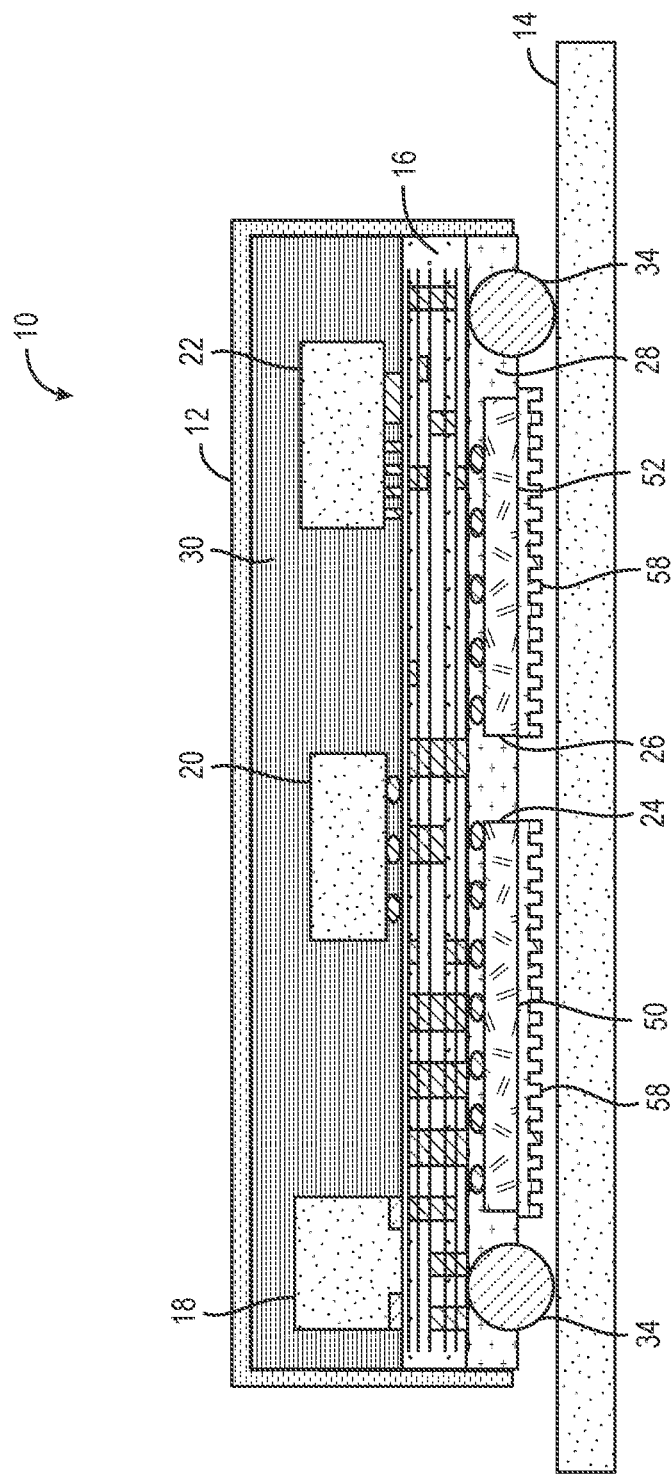
FIG. 4A illustrates an exemplary electronic device as in FIG. 2, having a device mounted to the exposed semiconductor die surface.
Figure 4B:
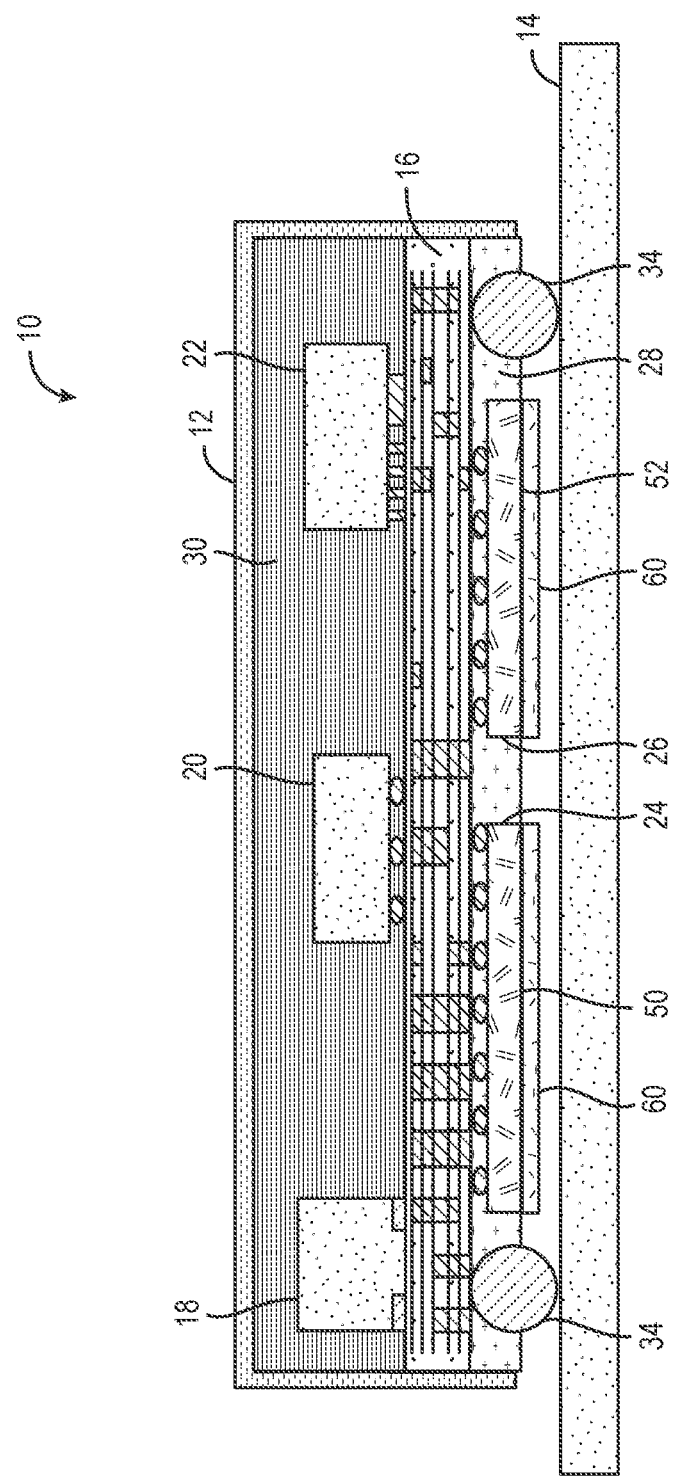
FIG. 4B illustrates an exemplary electronic device as in FIG. 2, having another device mounted to the exposed semiconductor die surface.
Figure 4C:
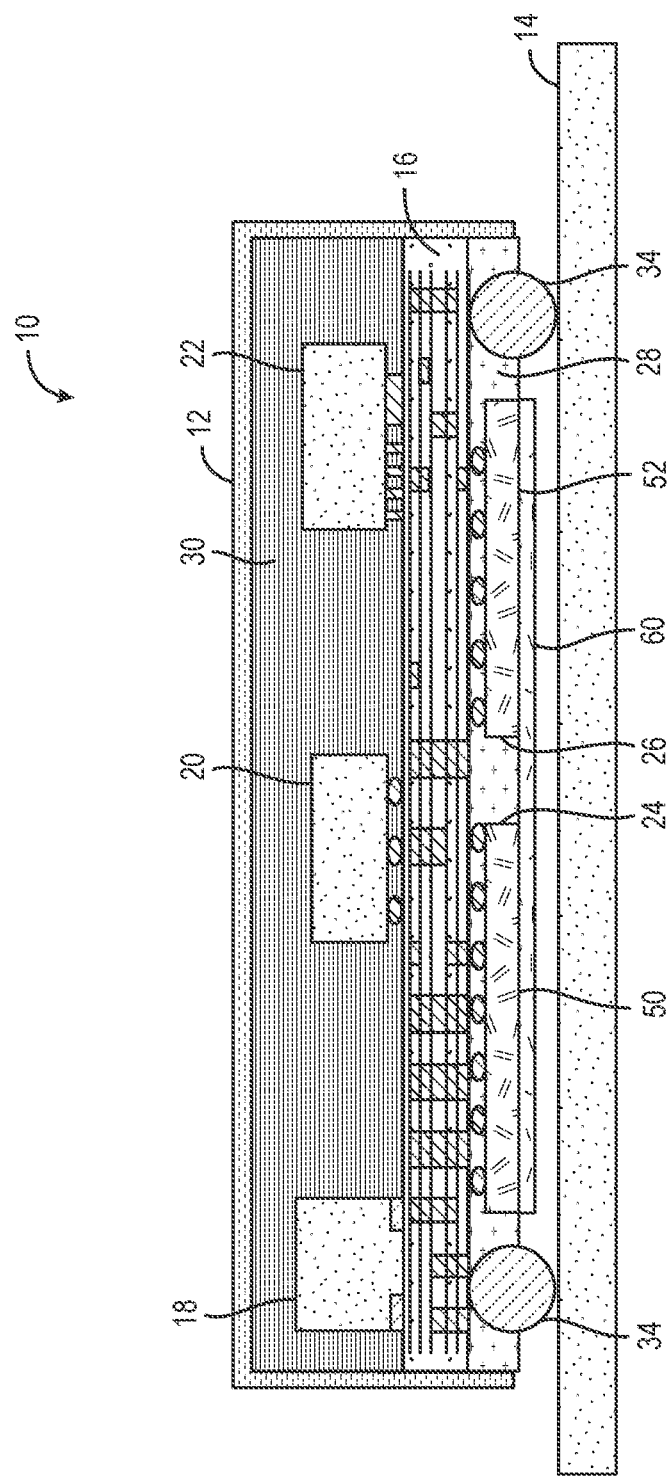
FIG. 4C illustrates an exemplary electronic device as in FIG. 2, having another device mounted to the exposed semiconductor die surface.
Figure 4D:
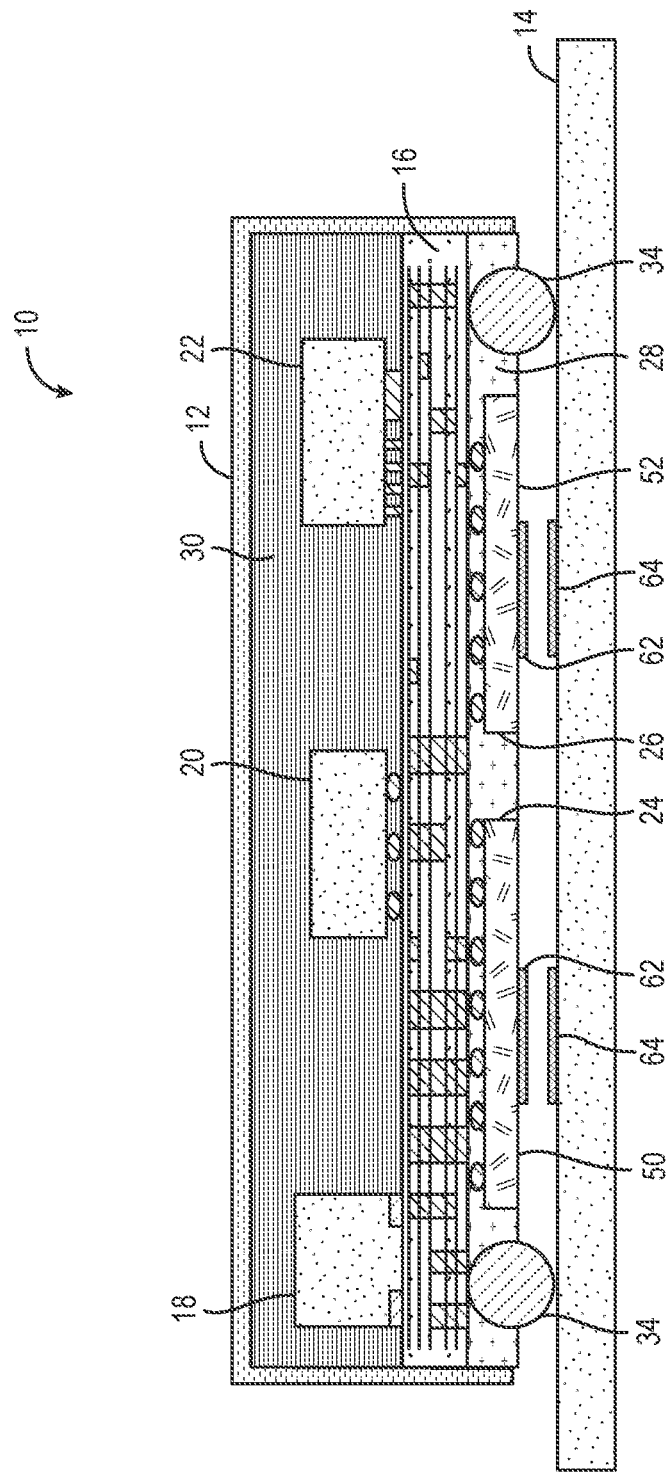
FIG. 4D illustrates an exemplary electronic device as in FIG. 2, having a connection formed between the exposed semiconductor die surface and the circuit board.
Figure 4E:
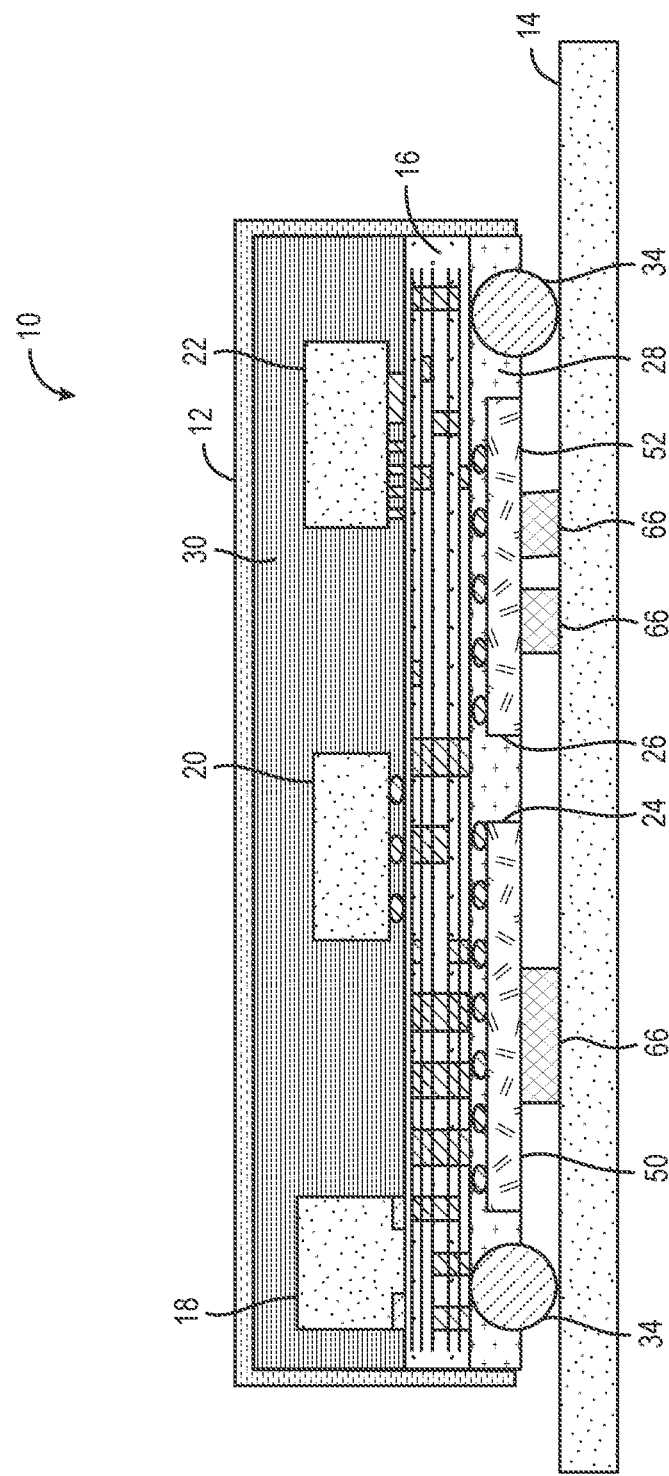
FIG. 4E illustrates an exemplary electronic device as in FIG. 2, having another connection formed between the exposed semiconductor die surface and the circuit board.
Figure 4F:
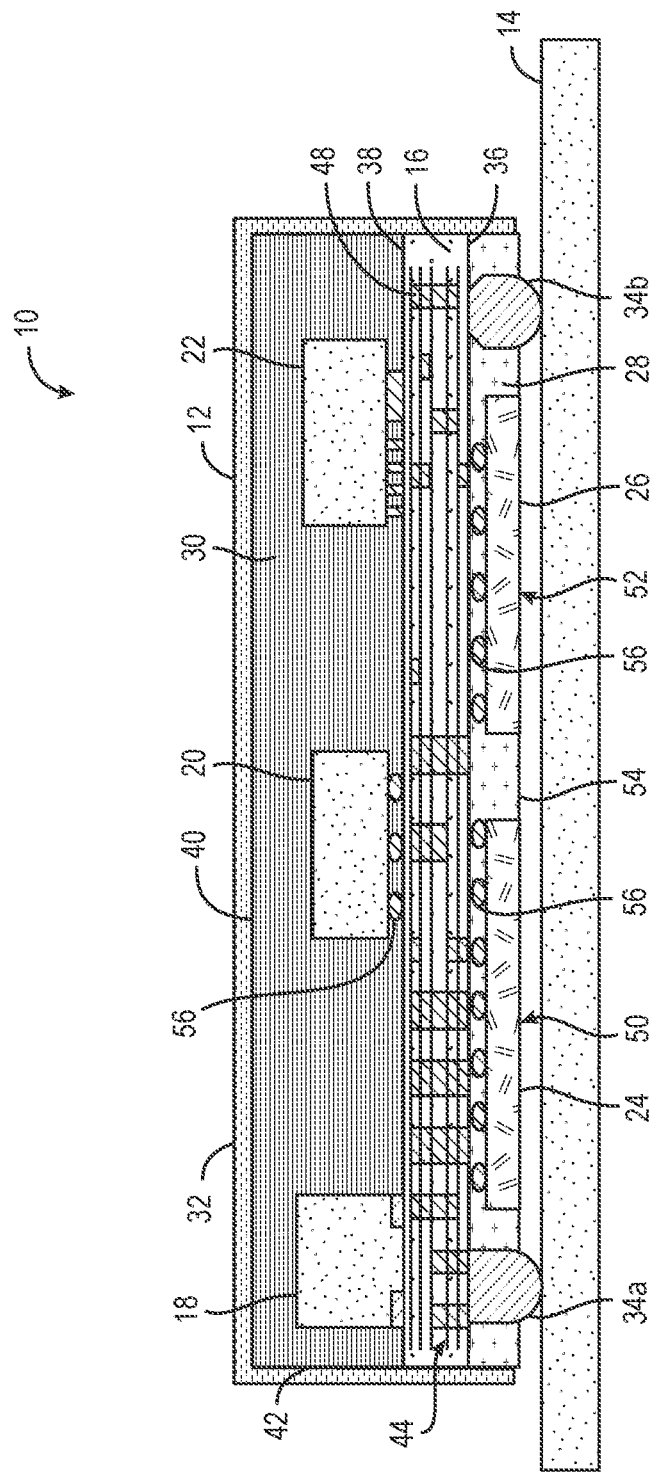
FIG. 4F illustrates an exemplary electronic device as in FIG. 2, having variations in its components.

Exposure of the semiconductor die surface 50, 52 can provide additional advantages, such as by providing a surface for coupling a device to one or more of the bottom electronic components 24, 26 as depicted in FIGS. 4A-4C. The exposed semiconductor die surface 50, 52 can also facilitate connections between at least one of the bottom electronic components 24, 26 and the circuit board 14, as depicted in FIGS. 4D and 4E. Variations in the components of the IC module 12 are contemplated, such as depicted in FIG. 4F.

FIG. 4A illustrates an exemplary electronic device 10 as in FIG. 2, having a device mounted to the exposed semiconductor die surface 50, 52. In some examples, one or more of the bottom electronic components 24, 26 may benefit from direct heat transfer, such as heat dissipation. In such examples, a heat exchanger 58 may be coupled to the exposed semiconductor die surface(s) 50, 52 of the bottom electronic component(s) 24, 26. This can improve the performance of the bottom electronic component(s) 24, 26 and/or prevent damage to the bottom electronic component(s) 24, 26 during operation. The heat exchanger 58 may be mounted to the bottom electronic component(s) 24, 26 and/or the first mold compound 28 through an adhesive material (e.g., a thermal adhesive) or another appropriate technique.

In other examples, one or more of the bottom electronic components 24, 26 may include a sensor (e.g., a temperature sensor, a pressure sensor, and so on) or other device, as depicted in FIGS. 4B and 4C. In an exemplary aspect, a separate sensor substrate 60 (e.g., a conductive material, an optical material, and so on) can be coupled to each bottom electronic component 24, 26 including a sensor as depicted in FIG. 4B. In another aspect, the sensor substrate 60 can be coupled to more than one bottom electronic component 24, 26 as depicted in FIG. 4C. The sensor substrate 60 can facilitate operation of the sensor. In some examples, the sensor substrate 60 may be omitted and the sensor in the bottom electronic component 24, 26 can perform its operations directly.

FIG. 4D illustrates an exemplary electronic device 10 as in FIG. 2, having a connection formed between the exposed semiconductor die surface 50, 52 and the circuit board 14. In some examples, a conductive pad 62 is coupled to the semiconductor die surface 50, 52 and a corresponding conductive pad 64 is coupled to the circuit board 14. The conductive pad 62 and/or the corresponding conductive pad 64 can be an exposed or insulated trace, pad, coil, or another shape. The conductive pad 62 and the corresponding conductive pad 64 can exchange signals and/or power through an indirect electromagnetic technique, such as inducing electrical signals through electrical, magnetic, capacitive, or inductive techniques. In some examples, the conductive pad 62 can be included within the bottom electronic component 24, 26 rather than coupled to the semiconductor die surface 50, 52.

In other examples, a direct electrical connection may be formed between one or more of the bottom electronic components 24, 26 and the circuit board 14 through the exposed semiconductor die surface 50, 52 as illustrated in FIG. 4E. For example, one or more conductors 66 can be coupled between the semiconductor die surface 50, 52 and the circuit board 14. The conductors 66 can be deposited on or coupled to each of the semiconductor die surface 50, 52 and the circuit board 14 through soldering, an adhesive (e.g., a conductive adhesive), vapor deposition, printing, and similar techniques. The conductors 66 can facilitate an exchange of power and/or signals between the bottom electronic component(s) 24, 26 and one or more devices coupled to the circuit board 14 (not shown).

Those skilled in the art will recognize improvements and modifications to the preferred embodiments of the present disclosure. All such improvements and modifications are considered within the scope of the concepts disclosed herein and the claims that follow.

For example, FIG. 4F illustrates an exemplary electronic device 10 as in FIG. 2, having variations in its components. In particular, the IC module 12 may include modules contacts 34a, 34b having different shapes. For example, one or more of the module contacts 34a may have a substantially planar surface attached to the bottom side 36 of the module substrate 16. In other examples, one or more of the module contacts 34b may include a notched or otherwise irregular surface attached to the bottom side 36 of the module substrate 16. As described above, the module contacts 34a, 34b may be solder bumps or copper pillars forming an electrical connection with the circuit board 14. The surfaces of the module contacts 34a, 34b attached to the bottom side 36 of the module substrate 16 may be machined, molded, or otherwise formed as depicted in FIG. 4F. It should be understood that other variations and modifications of the IC module 12 and its components are also contemplated herein.

What is claimed is:

1. A method for assembling a radio frequency (RF) module, comprising:
coupling an electronic component configured for RF operation to a top side of a module substrate;
encapsulating the electronic component in a first mold compound;
coupling a semiconductor die to a bottom side of the module substrate;
attaching a plurality of module contacts at the bottom side of the module substrate;
encapsulating the semiconductor die and the plurality of module contacts in a second mold compound such that the second mold compound at least partially surrounds the semiconductor die;
removing a portion of the second mold compound to expose a surface of the semiconductor die; and
attaching a sensor substrate to the exposed surface of the semiconductor die after removing the portion of the second mold compound.

2. The method of claim 1, wherein removing the portion of the second mold compound exposes each of the plurality of module contacts which extend from the bottom side of the module substrate to below the surface of the semiconductor die.

3. The method of claim 1, wherein removing the portion of the second mold compound exposes a bottom surface of the semiconductor die facing opposite the module substrate.

4. The method of claim 1, wherein coupling the semiconductor die to the bottom side of the module substrate further comprises coupling a plurality of conductive elements between the semiconductor die and the bottom side of the module substrate.

5. The method of claim 4, wherein encapsulating the semiconductor die in the second mold compound comprises at least partially surrounding each of the plurality of conductive elements.

6. The method of claim 4, wherein encapsulating the semiconductor die in the second mold compound comprises fully surrounding each of the plurality of conductive elements.

7. The method of claim 1, further comprising at least partially surrounding the first mold compound with a shielding structure.

8. The method of claim 7, wherein the shield layer entirely covers a top surface of the RF module and almost entirely covers a side surface of the RF module.

9. The method of claim 1, wherein removing the portion of the second mold compound forms a planar bottom module surface defined by the second mold compound and the surface of the semiconductor die.

10. The method of claim 9, wherein the plurality of module contacts extends below the planar bottom module surface.

11. The method of claim 9, wherein a distance between the planar bottom module surface and the bottom side of the module substrate is between 80 µm and 200 µm.

12. The method of claim 1, further comprising coupling the plurality of module contacts to a secondary substrate, wherein the plurality of module contacts provide an electrical connection between the module substrate and the secondary substrate.

13. The method of claim 1, wherein each of the plurality of module contacts is a solder ball.

* * * * *